(12) United States Patent
Pham et al.

(10) Patent No.: US 6,320,768 B1
(45) Date of Patent: Nov. 20, 2001

(54) POWER SUPPLY PULSE WIDTH MODULATION (PWM) CONTROL SYSTEM

(75) Inventors: Mau Pham, Orange, CA (US); Michael T. Madigan, Cary, NC (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/684,285

(22) Filed: Oct. 6, 2000

(51) Int. Cl.[7] .................................................... H02M 1/12
(52) U.S. Cl. ............................................................ 363/41
(58) Field of Search ................................. 363/40, 41, 95, 363/97, 131; 323/282, 283

(56) References Cited

U.S. PATENT DOCUMENTS 4,353,113 * 10/1982 Billings .................................... 363/21
5,815,381 * 9/1998 Newlin .................................... 363/17
6,011,706 * 1/2000 Adragna et al. ........................ 363/41
6,188,588 * 2/2001 Hemena et al. ........................ 363/21

* cited by examiner

Primary Examiner—Matthew Nguyen
(74) Attorney, Agent, or Firm—Dwight N. Holmbo; Wade James Brady, III; Frederick J. Telecky, Jr.

(57) ABSTRACT

A power supply pulse width modulation (PWM) control system uses peak current program mode (CPM) control for large duty ratios with a smooth transition to voltage mode control at small duty ratios down to zero duty ratio. The PWM control system implements the latch function in an analog, circuit in contrast with commonly employed digital solutions, further resulting in low delay times since it does not have logic and set-up delays that are associated with latches.

33 Claims, 6 Drawing Sheets

POWER SUPPLY PULSE WIDTH MODULATION (PWM) CONTROL SYSTEM

BACKGROUND OF THE INVENTION

1. Field of the Invention

This invention relates generally to power supply pulse width modulation (PWM) control systems and methods, and more particularly to a power supply PWM method and system that uses peak current program mode (CPM) control for large duty ratios with a smooth transition to voltage mode control at small duty ratios down to zero duty ratio.

2. Description of the Prior Art

Current program mode (CPM) is a popular PWM control technique used in switched mode power supply technology. The duty ratio is determined when the switch current reaches a peak value that is requested by a control voltage. Often, the control voltage is a compensated version of the error between a power supply output voltage and a fixed reference. At normal operating levels, the switch current and the requested peak current are larger than the noise in the system, and they are sufficiently centered between comparator supply voltages and error-amplifier supply voltages in order to have smooth operation at large duty ratios and large currents. When a small duty ratio is required however, (i.e., below a few percent), the current sense signal becomes too small and too close to ground for the PWM comparator to successfully distinguish the greater of the current sense signal and the control voltage signal. This scenario is encountered in a PWM controlled power supply operating at light load conditions. The unfortunate result is that the duty ratio erratically jumps between zero and a minimum duty ratio. The result to the rest of the converter is that the output voltage will lose regulation and transformer isolated topologies may experience over-current conditions from saturation that is caused by the erratic behavior. Small duty ratios and high switching frequencies are also limited by the delay in the logic that is required to detect and latch the pulse width information each switch cycle.

In view of the foregoing,, a need exists for a power supply pulse width modulation (PWM) scheme that improves light load/low duty ratio performance in current program mode (CPM) controlled switched mode converters and that increases speed by eliminating the PWM latch and its associated delay.

SUMMARY OF THE INVENTION

The present invention is directed to a power supply PWM control technique that uses peak current program mode (CPM) control for large duty ratios with a smooth transition to voltage mode control at small duty ratios down to zero duty ratio and that improves the speed of modulation. A PWM comparator is implemented so that it operates in three different modes, depending on the current sense level. The PWM comparator performs CPM control (first mode) over most of the control range where the current sense levels are large. For small current sense levels, the PWM comparator performs voltage mode control (second mode), causing the duty ratio to be proportional to the control voltage. Voltage mode control is where the duty ratio is determined by a voltage or voltage error signal. The PWM comparator has a small operating range where the first and second modes overlap in order to facilitate a smooth transition between CPM and voltage mode control ranges. A third mode of operation occurs when the control voltage becomes low enough to drive the duty ratio to zero without any intermittent pulses.

In one aspect of the invention, a power supply PWM control technique is implemented using, an unbalanced comparator and relying on a cut-off threshold in order to determine the mode of modulation.

In another aspect of the invention, a power supply PWM control technique is implemented additionally using a differential amplifier in order to achieve balanced operation for high noise immunity at high speeds.

In yet another aspect of the invention, a power supply PWM technique is implemented using another differential amplifier whose purpose is to set the point where the mode of modulation changes by a reference instead of relying, on parasitic cut-off thresholds.

In still another aspect of the invention, a power supply PWM technique is implemented using a capacitor to store the state of the modulator in contrast to the PWM latch.

In still another aspect of the invention, a power supply PWM technique is implemented in which the PWM controller smoothly transitions from a first mode through a third mode and back so that the power supply output remains smoothly controlled.

In still another aspect of the invention, a power supply PWM technique is implemented in which the amount of delay is greatly reduced due to the size of the PWM state capacitor and its functional location.

BRIEF DESCRIPTION OF THE DRAWINGS

Other aspects and features of the present invention and many of the attendant advantages of the present invention will be readily appreciated as the same become better understood by reference to the following detailed description when considered in connection with the accompanying drawings in which like reference numerals designate like parts throughout the figures thereof and wherein.

While the above-identified drawing, figures set forth particular embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION OF THE PREFERRED EMBODIMENTS

Figure 1:
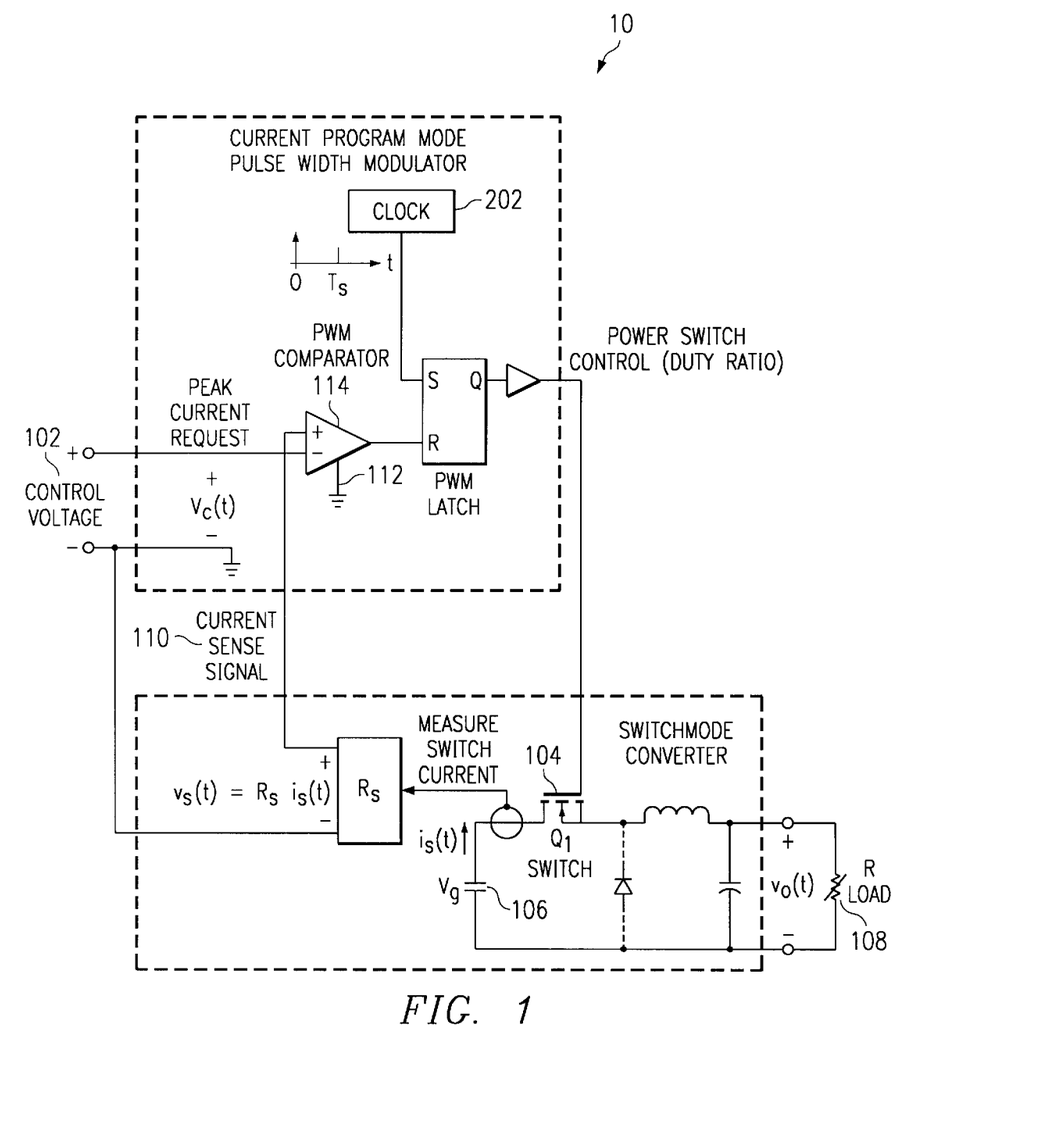
FIG. 1 is a schematic diagram illustrating an ideal current program mode pulse width modulated switched mode converter.
Figure 2:
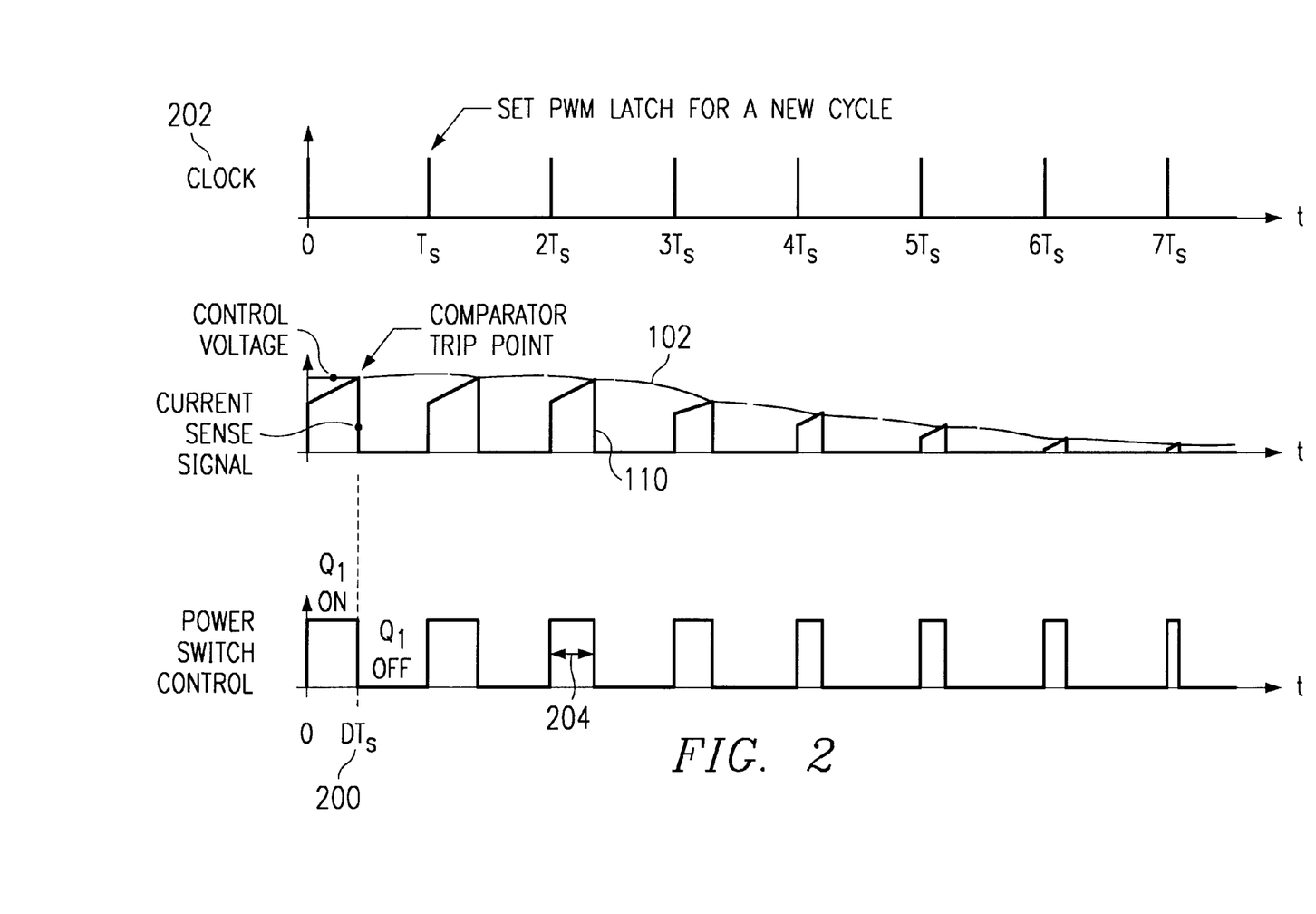
FIG. 2 illustrates signal waveforms associated with the ideal current program mode pulse width modulated switched mode converter shown in FIG. 1.

FIG. 1 is a schematic diagram illustrating an ideal current program mode pulse width modulated switched mode converter 10 that is discussed herein below to better illustrate the advantages provided by aspects of the present invention depicted in FIGS. 4–6. The Control Voltage 102 shown in FIG. 1 simply sets the peak current level in switch $Q_1$ 104. FIG. 2 illustrates signal waveforms associated with the ideal current program mode pulse width modulated switched mode converter 10 shown in FIG. 1. Duty ratio 'D' 200 is the time duration that switch $Q_1$ 104 is ON during, a switch cycle divided by the duration of that cycle, determined by CLOCK 202. The duty ratio is related to how much energy is transferred from power source input $V_g$ 106 to R Load 108. Higher duty ratios result in a higher energy transfer from the source $V_g$ 106 to R Load 108. Conversely, lower duty ratios result in lower energy transfer from the source $V_g$ 106 to R Load 108. Looking again at FIG. 2, the Control Voltage 102 can be seen to be moving, much slower than the Current Sense signal 110 (as seen in typical applications). The present invention takes advantage of the difference in rates of change between the Control Voltage 102 and the Current Sense signal 110.

The bias connection 112 to ground on the PWM comparator 114 is the only non-ideal condition that is depicted in FIG. 1. Regarding, a practical implementation, this connection 112 results in the PWM comparator 114 losing sensitivity when either or both the Control Voltage signal 102 and the Current Sense signal 110 are close to the bias connection 112 voltage (around in this case). Performance degradation typically occurs at levels below 200 mV.

With continued reference to FIG. 2, it can be seen that the pulse width 204 is wide during the range $0<t<3T_s$, and the Current Sense signal 110 level is well above the ground bias level. Wider duty ratios ultimately result in larger signals due to higher energy transfer. At narrower duty ratios however, (in the range $3T_s<t<6T_s$), the Current Sense signal 110 level is small, and perhaps close enough to the round bias level that the PWM comparator 114 has difficulty in correctly distinguishing which signal is larger.

Figure 3:
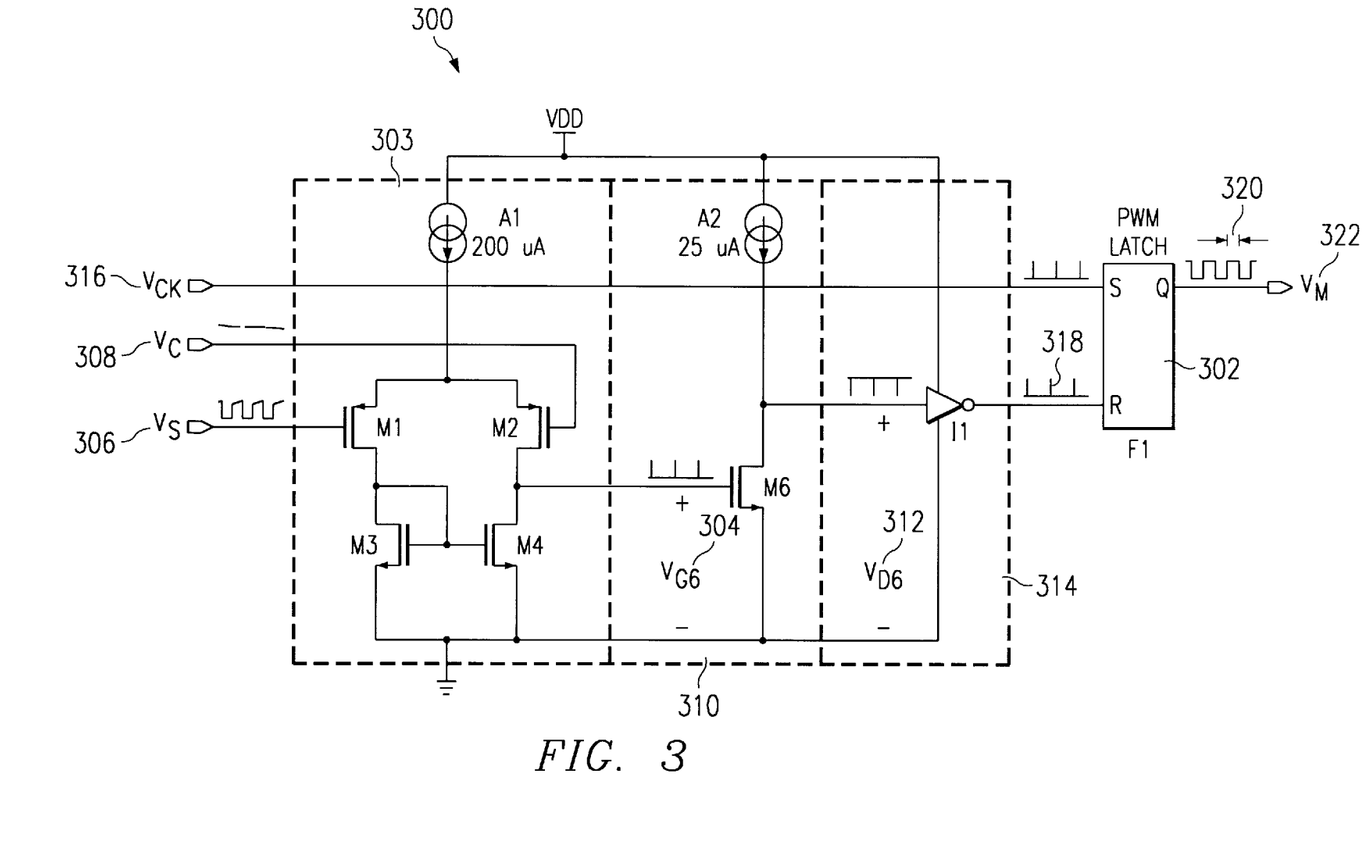
FIG. 3 is a schematic diagram illustrating a prior art comparator.

FIG. 3 is a schematic diagram illustrating a prior art high speed PWM comparator 300 and PWM latch 302. The first stage of the PWM comparator 300 includes M1, M2, M3, M4 and A1 to implement a differential amplifier 303 whose output voltage $V_{G6}$ 304 is proportional to the difference between the input voltages $V_S$ 306 (Current Sense) and $V_C$ 308 (Control Voltage). The gain of the first stage differential amplifier 303 is however, large enough so that the differential amplifier 303 saturates. The second stage 310 includes M6 and A2 which together inverts and amplifies the signal $V_{G6}$ 304. Current source A2 causes the rising edge of $V_{D6}$ 312. The third stage 314 includes inverter I1 that inverts signal $V_{D6}$ 312 and resets PWM latch 302. The duration between the set signal, $V_{CK}$ 316, and the reset signal 318 is the ON duration 320, as shown in signal $V_M$ 322. Inverter I1 also serves as a low impedance buffer between the amplification stage 310 and the logic stages in PWM latch 302.

The prior art high speed PWM comparator 300 and PWM latch 302 combine to formulate a system that is robust to noise, but suffers from delays that are imposed by PWM latch 302. An offset to $V_{G6}$ 304 must be incorporated in order for the comparator 300 and latch 302 to function properly. Generally, this offset is implemented by selecting M2 to have much larger gain and drain-source admittance than M1. Further, the differential amplifier 303 gain must be high in order to supply enough signal to cross the thresholds of inverter I1. High gain is a conflicting, requirement with high speed. Further, the digital nature of the PWM Comparator 300 and PWM Latch 302 in this implementation causes the output $V_M$ 322 to suddenly lose signal when $V_S$ 306 and $V_C$ 308 become small signals. This characteristic will cause pulse skipping at low duty ratios.

The PWM Comparator 300 and PWM Latch 302 schemes depicted in FIG. 3 have been problematic when operating at low duty ratios. Specifically, two deficiencies associated with this scheme can cause pulse skipping while operating at a low duty ratio. These are 1) insufficient signals and 2) delay. High gain in the differential stage 303 is achieved at the expense of speed. Insufficient signals occur at narrow duty ratios because the slope of the current sense signal 306 is very low which results in a small differential signal. The differential signal $V_{G6}$ 304 can be too small to activate M6, thus causing a pulse to be skipped. An insufficient signal can be easily contaminated with stray couplings that make the skipping problem worse. Delay causes duty cycle skipping in the following, manner. The differential amplifier 303 requires time to settle after the rising, edge of $V_S$ 306 in order to make an accurate comparison between $V_S$ 306 and $V_C$ 309. The latch 102 requires set-up time and it imposes delays due to its internal logic gates and feedback. A pulse will be skipped on the switch cycle following, a command for a narrower pulse than the delay through the comparator 300 and the latch 302.

The prior art comparator 300 and latch 302 therefore have a minimum duty ratio below which the duty ratio falls to zero. The performance and offsets of the differential amplifier 303 depend on parasitic couplings that are distributed in the circuit between VDD, A1, M1, M2, M3 and M4. Many of the parasitic features vary substantially over temperature and over manufacturing process. The performance of this topology scheme at narrow duty ratios is inconsistent over temperature and manufacturing lots. Imposing a positive offset on $V_{G6}$ 304 in order to reduce the amount that $V_{G6}$ 304 goes below the threshold of M6 can reduce the minimum duty ratio effect. Intentionally making, M2 have more gain than M1 is the typical method for achieving an offset. The unbalanced technique is limited however, due to variations in the parasitic devices and the drawback that unbalanced operation increases the effects of noise.

Figure 4:
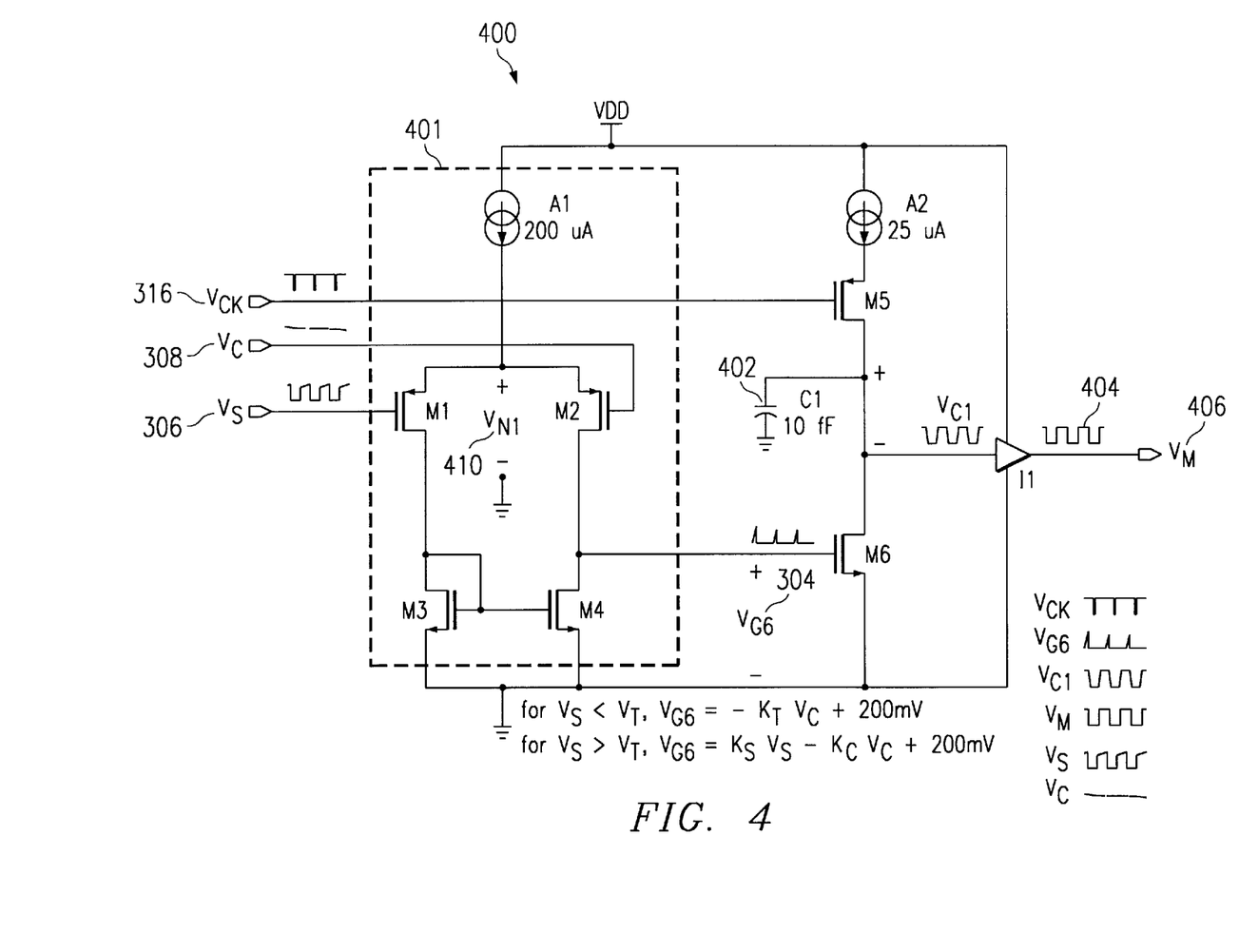
FIG. 4 is a schematic diagram illustrating a PWM comparator with its latching function performed by a capacitor according to one embodiment of the present invention.

FIG. 4 is a schematic diagram illustrating a PWM comparator 400 with its latching function performed by a capacitor 402 according to one embodiment of the present invention. The scheme depicted in FIG. 4 functions to make the duty cycle control range smooth by implementing the memory function of the latch as an analog storage device, (capacitor 402). The differential amplifier stage 401 can operate linearly as either an amplification stage or as a comparator to provide the same functional response. The gain of the differential amplifier stage 401 can thus be lowered to achieve a higher speed. This solution overcomes the digitally imposed delay of the PWM Latch 302 by performing the function in a capacitor 402 (a stray node capacitance is of suitable size). The differential amplifier stage 401 is implemented as discussed herein above, except the gain is kept much lower. The digital conversion occurs in the buffer stage, I1. The foregoing PWM Latch 302 could alternatively be left in the circuit as a redundancy feature, but is not necessary in most applications.

As stated above, the differential amplifier stage 401 comprises transistors M1, M2, M3, M4 and A1. Capacitor (C1) 402 is the PWM memory device. Transistor M6 is the PWM Memory discharge device and transistor M5 is the PWM SET device. Buffer I1 is a non-inverting buffer whose output is directly the PWM signal 404. Buffer I1 also removes loading, effects that may be externally imposed on the $V_M$ output terminal 406.

Capacitor (C1) 402 is the most obvious difference between the prior art circuit 300 shown in FIG. 3 and the circuit 400 shown in FIG. 4. Further, switch M5 is in cascade with current source A2. The latching function is achieved by the fact that the differential amplifier stage 401 can only discharge capacitor (C1) 402. The differential amplifier stage 401 cannot charge capacitor (C1) 402. Current source A2 and transistor MS form the only path through which capacitor (C1) 402 can charge. As in the prior art circuit 300, offset for low $V_S$ 306 and $V_C$ 308 operation is achieved by selecting, M2 to have much larger gain and drain-source admittance than M1.

Operation of the PWM comparator 400 is now explained below. At the beginning of a clock cycle, a LOW value of $V_{CK}$ 316 saturates M5 and allows A2 to charge C1. This will cause the output of node 406 to change from LOW to HIGH, which in turn causes the external converter switch (not shown) to turn ON causing, the switch current to rise which is then detected on $V_S$ 306. Voltage $V_{CK}$ 316 is low for enough time to ensure that C1 is fully charged. When $V_{CK}$ 316 becomes HIGH, it cuts OFF the charge to C1 (voltage $V_{C1}$ can only be reduced during this interval by M6). When the external switch current becomes large enough, it drives the differential amplifier 401 to turn-ON M6 which then bleeds charge from C1. When the charge is reduced so that voltage $V_{C1}$ is less than the logic threshold on I1, output $V_M$ falls to LOW, thus terminating the ON duty of the external switch. The switch current and sense voltage $V_S$ 306 fall to zero. Voltage $V_{C1}$ will remain low for the rest of the switch cycle because the differential amplifier 401 can only act to lower $V_{C1}$. The foregoing cycle then repeats.

Low duty ratio operation normally occurs when the external converter (not shown) is lightly loaded. Essentially, the external switch current has smaller peaks at lighter loads; the sense signal $V_S$ 306 and the command signal $V_C$ 308 are typically smaller for this type operation. Node voltage $V_{N1}$ 410 is proportional to $V_S$ 306 plus $V_C$ 308, which in turn sets the limit of $V_{G6}$ 304. The extreme zero duty ratio case occurs when $V_S$ 306 and $V_C$ 308 are small enough to cause M6 to slowly discharge C1. Here, the lower $V_C$ 308, the faster C1 discharges and the shorter the duty ratio. The capacitance of C1 and the transconductance gain of M6 determine the gain at which the pulse width is determined when the PWM Comparator 400 is operating at low duty ratios. At higher duty ratios, $V_S$ 306 and $V_C$ 308 are large enough to quickly discharge C1 and the capacitance of C1 and the transconductance gain of M6 do not significantly affect the duty ratio.

The differential amplifier stage 401 is intentionally unbalanced to implement desired bias characteristics and to reduce noise. Unbalanced operation is achieved by selecting transistor M2 to have more gain than transistor M1. The effect is that $V_C$ 308 will have all apparent offset, which means that the command for zero duty ratio will be a small $V_C$ 308 voltage above ground. The value of the offset is related to gain differences and thresholds, and does not lend itself to a convenient analytic solution. Typically, the offset is designed using, trial and error methods. The offset will vary over temperature and over manufacturing lots by as much as 3.5 to 1. The present inventors found laboratory implementations to have offsets ranging, from 0.35V to 1.2V. The offset range is adequate for many low performance solutions however, due to the control system design advantages discussed herein.

The impact of the offset discussed herein above is distinctly different between prior art PWM Comparator 300 and the present PWM Comparator 400. Sense voltage $V_S$ 306 for PWM Comparator 400 has no effect on $V_{G6}$ 304 for voltages below the threshold of M3, $V_T$(M3). Transistor M2 however, can effect $V_{G6}$ 304 when it is below its offset voltage, $V_{offset}$, but above the threshold voltage of M6. Thus, for $V_S < V_T$ (M3) and $V_T(M6) < V_C < V_{offset}$, M6 will discharge C1 proportional to $V_{offset} - V_C$. This is the range in which the modulator operates in Voltage Mode Control. The range is between the offset and point when $V_{G6}$ 304 is insufficient to turn-OFF M6.

Although the PWM Comparator 400 has improved performance over the prior art PWM Comparator 300, its still possesses an unbalanced differential stage 401. Unbalanced operation results in poor power supply rejection and a general susceptibility to input disturbances. Switched-mode converters often serve as a high-energy source for noise and disturbances. It is thus advantageous to improve the noise rejection of input stages of PWM controllers.

Noise rejection is significantly improved if the inputs to a differential stage have the same impedance and the same gain. This means that the input transistors of the differential stage should be matched in impedance, gain and stray coupling in order to minimize the effects of noise. As stated above, the input transistors of PWM Comparator 400 are not matched in order to introduce a DC offset to the differential stage 401. It is therefore desirable to incorporate matched inputs to improve the operation of PWM Comparator 400.

Figure 5:
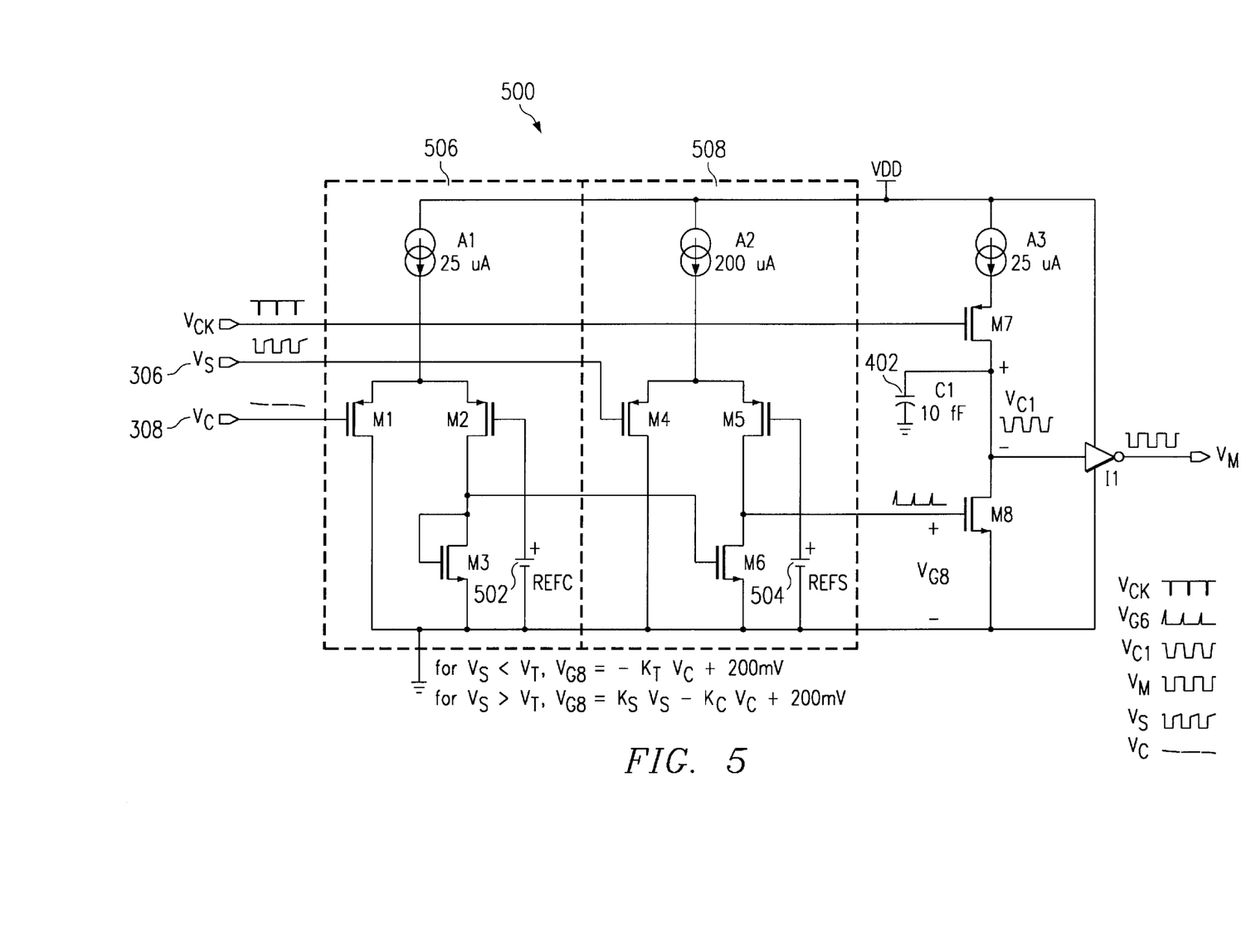
FIG. 5 is a schematic diagram illustrating the PWM comparator shown in FIG. 4 having balanced input stages added thereto in accordance with one embodiment of the present invention.

FIG. 5 is a schematic diagram illustrating a PWM comparator 500 having a latching capacitor 402 and balanced input stages added thereto in accordance with one embodiment of the present invention. The reference voltage sources REFC 502 and REFS 504 establish the DC offsets for setting the bias of M6 and M8 respectively. The reference voltage sources PEFC 502 and REFS 504 can be formed from a resistive divider or a current source applied to a resistor or any other technique for establishing a constant voltage source. The Command stage 506 is the differential stag,e that has components M1, M2, M3 and A1. The Sense stage 508 is the differential stage that has components M4, M5, M6 and A2.

Although there are differences in propagation delays between $V_C$ 308 and VC1 compared to $V_S$ 306 and VC1, they do not pose a problem to the PWM Comparator system 500 performance. In most converter designs, the command signal $V_C$ 308 is an error voltage that changes slowly over many switching cycles. In contrast, the sense signal $V_S$ 306 changes quickly during a single switch cycle. The Sense stage 508 is positioned to be the nearest stage to the discharge stage M8. There is less delay from the Sense stage 508 to the discharge stage M8 than there is from the Command stage 506 to the discharge stage M8 due to the cascade configuration. Additionally, the bias current A2 of the Sense stage 508 is much larger and transistors M4 and M5 have higher transconductance than those of the Command stage 506 do. The effect here is an enhancement in the difference between the response speeds of the two differential stages with the benefit of lower power consumption due to the lower A1 bias current in the Command stage 506.

Many PWM converters operating in Current Program Mode with duty ratios above 50% require slope compensation. This is accomplished by either adding a sawtoothed ramp voltage to $V_S$ 306 or subtracting a saw-toothed ramp from $V_C$ 308. The first case would use the implementation as seen in FIG. 5. The second case would require that the speed of the Command differential stage 506 would use the same level of bias current and the same sized transistors as the Sense differential stage 508.

The PWM Comparator 500 has similar disadvantages as discussed herein above with reference to FIG. 4. Transconductance gains and device thresholds determining the voltage level where $V_S$ 306 ceases to effect the duty ratio in both systems 400, 500. Although such implementations are suitable for many converters with high gain feedback, they are not suitable for all feedback loops. The types of feedback loops that perform best with the systems 400, 500 shown in FIGS. 4 and 5 respectively, are feedback controllers that integrate the error at DC. The reason is the DC offsets are corrected for due to the DC integration. Integrating, controllers require that the rest of the PWM converter have a high degree of stability about the operating point. Some converters do not have this degree of stability and they require that the threshold is consistent across temperature and lot variations, as stated herein before.

Figure 6:
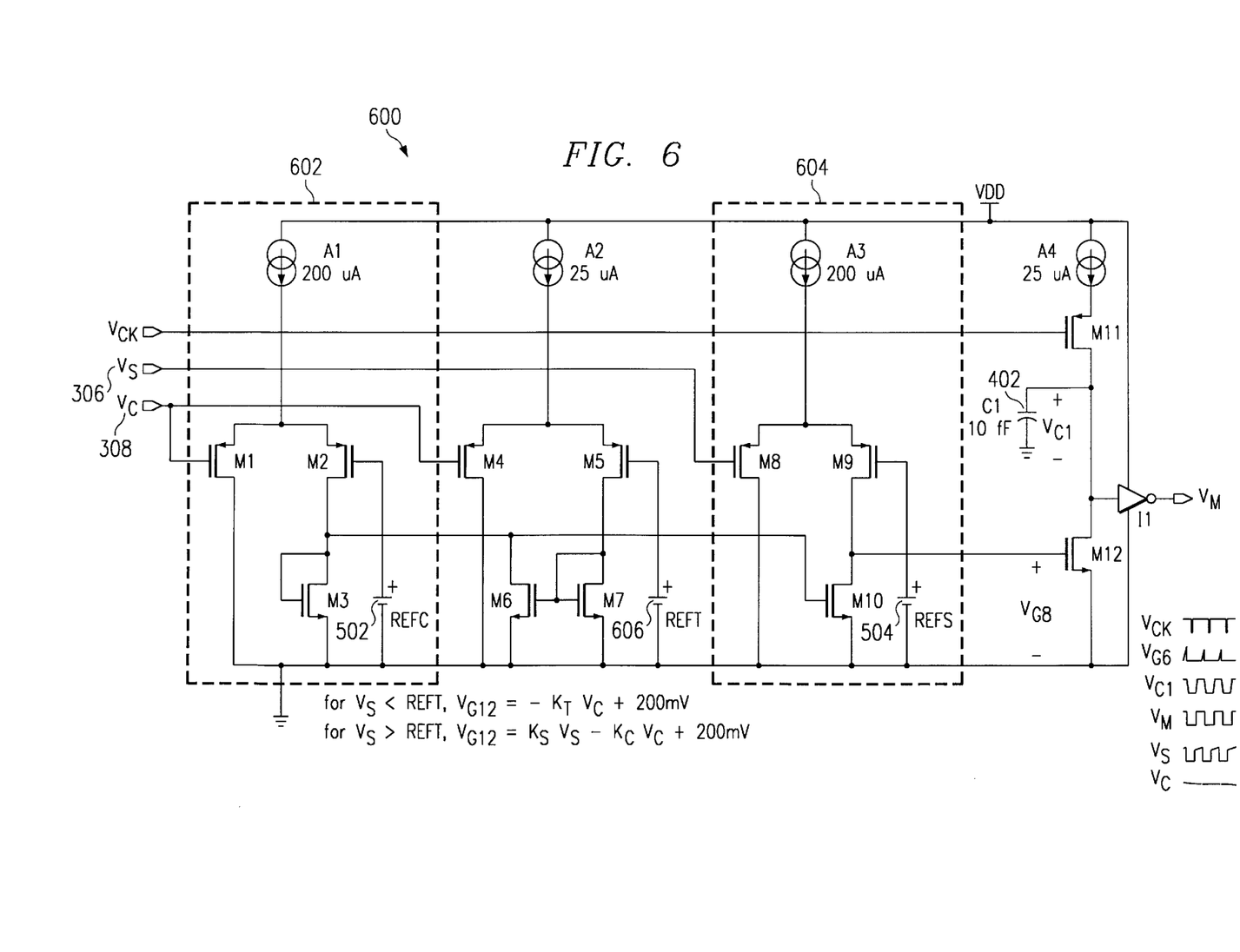
FIG. 6 is a schematic diagram illustrating a PWM comparator having a capacitive latch, high-speed command stage, high-speed sense stage and independent offset and threshold settings in accordance with one embodiment of the present invention.

The present inventors solved this problem by introducing another differential stage as illustrated in FIG. 6 that has a reference that can set the transition voltage level where $V_S$ 306 to effect the duty ratio independent of other circuit gains and bias currents. FIG. 6 is a schematic diagram illustrating a PWM comparator 600 having a capacitive latch 402, high-speed command stage 602, high speed sense stage 604 and independent offset and threshold settings (REFC 502, REFT 606 and REFS 504) in accordance with one embodiment of the present invention. Voltage reference REFT 606 is the threshold of $V_C$ 308 between Current Program Mode control and Voltage Mode control and voltage reference REFT 606 can be formed from a resistive divider or a current source applied to a resistor or any other technique for establishing a constant voltage source.

As stated herein before, although the prior art PWM Comparator system 300 is robust to noise, it suffers from delays that are imposed by (F1) 302. Therefore, in order for this comparator 300 to function properly for low ranges of $V_S$ 306, an offset to $V_{G6}$ 304 must be incorporated. Typically, the offset is implemented by selecting M2 to have much larger gain and drain-source admittance than M1. Further, the differential amplifier 303 gain must be high in order to supply enough signal to cross the thresholds of inverter I1. High gain, as stated above, is a conflicting requirement with high speed. The digital nature of the PWM Comparator 300 and latch 302 also causes the output $V_M$ 22 to suddenly loge signal when $V_S$ 306 and $V_C$ 308 become small signals which will cause pulse skipping at low duty ratios.

In summary explanation of the above, a PWM Comparator 600 implements the latch function in an analog circuit in contrast with prior art digital solutions. This has the benefit of low delay times and smooth transitions between modes of operations, which results in smooth operation to zero duty ratio. The prior art digital solution can merely operate to a minimum duty ratio, below which it hops between zero and the minimum duty ratio, thereby exhibiting erratic behavior at low duty cycle compared to the present analog, solution. The present solution further operates faster than prior art solutions since it does not have logic and set-up delays that are associated with latches. In view of the above, it can be seen the present invention presents a significant advancement in the art of PWM control technology. Further, this invention has been described in considerable detail in order to provide those skilled in the data communication art with the information needed to apply the novel principles and to construct and use such specialized components as are required. In view of the foregoing descriptions, it should further be apparent that the present invention represents a significant departure from the prior art in construction and operation. However, while particular embodiments of the present invention have been described herein in detail, it is to be understood that various alterations, modifications and substitutions can be made therein without departing in any way from the spirit and scope of the present invention, as defined in the claims which follow.

What is claimed is:

1. A power supply pulse width modulation (PWM) control system comprising:

a differential amplifier system having, a voltage control signal ($V_C$) input, a current sense ($V_S$) signal input and a signal output, the differential amplifier system operational to generate an output signal proportional to a difference between a current sense signal and a control voltage signal;

a capacitive PWM memory element;

a PWM memory set element operational in response to a PWM system clock signal to charge the capacitive PWM memory element;

a PWM memory discharge element operational in response to the differential amplifier system output signal to discharge the capacitive PWM memory element and to generate an analog PWM signal therefrom; and a digital converter operational in response to the analog PWM signal to generate a digital PWM output signal therefrom.

2. The power supply PWM control system according to claim 1 wherein the capacitive PWM memory element is a capacitor.

3. The power supply PWM control system according to claim 2 wherein the PWM memory set element is a PMOS transistor.

4. The power supply PWM control system according to claim 3 wherein the PWM memory discharge element is a NMOS transistor.

5. The power supply PWM control system according to claim 4 wherein the digital converter is a non-inverting buffer.

6. The power supply PWM control system according to claim 1 further comprising a current source in cascade with the PWM memory set element, the current source operational to transfer current to the capacitive memory element in response to each PWM system clock signal.

7. The power supply PWM control system according to claim 1 wherein the differential amplifier is unbalanced.

8. The power supply PWM control system according to claim 1 wherein the differential amplifier system comprises a current source, a first PMOS transistor having a source node connected to the current source, a gate node configured as the current sense signal input, and a drain; a second PMOS transistor having a source node connected to the current source, a gate node configured as the voltage control signal input, and a drain; a first NMOS transistor having a gate node, a drain node connected to its gate node and further connected to the first PMOS transistor drain node, and a source node connected to a system ground; and a second NMOS transistor having a ate node connected to the first NMOS transistor gate node, a drain node connected to the second PMOS transistor drain node, and a source node connected to the system ground.

9. The power supply PWM control system according to claim 8 wherein the second PMOS transistor is configured to have more gain than the first PMOS transistor.

10. The power supply PWM control system according to claim 1 wherein the differential amplifier system comprises a first differential stage having, the voltage control signal input and an output, a second differential stage having the current sense signal input, an input in communication with the first differential stage output, and further having the differential amplifier system output, wherein the first and second differential amplifier stages are operational to generate the output signal proportional to a difference between a current sense signal and a control voltage signal.

11. The power supply PWM control system according to claim 10 wherein the first differential stage comprises a first current source, a first PMOS transistor having a source node connected to the first current source, a gate node configured as the voltage control signal input and a drain connected to a system ground; a second PMOS transistor having, a source node connected to the first current source, a gate node and a drain node; an NMOS transistor having, a drain node connected to the second PMOS transistor drain node, a gate node connected to its drain node and a source node connected to the system ground; and a first reference voltage source connected at one end to the system ground and connected at its opposite end to the second PMOS transistor gate node, wherein the first reference voltage source is operational to establish a first DC offset voltage.

12. The power supply PWM control system according to claim 11 wherein the second differential stage comprises a second current source, a third PMOS transistor having a source node connected to the second current source, a gate node configured as the current sense signal input and a drain connected to a system ground; a fourth PMOS transistor having a source node connected to the second current source, a gate node and a drain node; a second NMOS transistor having, a drain node connected to the fourth PMOS transistor drain node, a gate node connected to the second PMOS transistor drain node and a source node connected to the system ground; and a second reference voltage source connected at one end to the system ground and connected at its opposite end to the fourth PMOS transistor gate node, wherein the second reference voltage source is operational to establish a second DC offset voltage and further wherein the first DC offset voltage is associated with the second NMOS transistor and is operational to establish its bias.

13. The power supply PWM control system according to claim 12 wherein the second current source is capable of providing a larger current than that provided by the first current source.

14. The power supply PWM control system according to claim 13 wherein the third and fourth PMOS transistors have a higher transconductance than that associated with the first and second PMOS transistors respectively.

15. The power supply PWM control system according to claim 14 wherein the differential amplifier system further comprises a third differential stage operational to set a transition voltage level where the current sense signal ceases to effect a duty ratio independent of other power supply PWM control system gains and bias currents.

16. The power supply PWM control system according to claim 1 wherein the differential amplifier system comprises a high speed command stage, a high speed sense stage and a differential stage having a reference capable of setting a transition voltage level where the current sense signal ceases to effect a duty ratio independent of other power supply PWM control system gains and bias currents.

17. The power supply PWM control system according to claim 16 further comprising a reference voltage source operational in association with the high speed command stage, the high speed sense stage and the differential stage to establish a voltage control signal threshold between Current Program Mode and Voltage Mode Control.

18. A power supply PWM control system comprising:
a first differential stage responsive to a voltage control signal ($V_C$) to generate a Voltage Mode Control signal,
a second differential stage responsive to a current sense ($V_S$) signal to generate a Current Program Mode Control signal;
a third differential stage in communication with the first differential stage and operational to establish a threshold for the voltage control signal associated with the first differential stage;
a capacitive PWM memory device;
a PWM memory set device operational in response to a PWM system clock signal to charge the capacitive PWM memory device;
a PWM memory discharge device operational in response to the first and second differential stage Control signals such that the capacitive PWM memory device can be discharged to generate an analog PWM signal therefrom and further such that the power supply PWM control system can transition between Current Program Mode Control and Voltage Mode Control; and
a digital converter operational in response to the analog PWM signal to generate a digital PWM output signal therefrom.

19. The power supply PWM control system according to claim 18 wherein the PWM memory device is a capacitor.

20. The power supply PWM control system according to claim 18 further comprising a first reference voltage source configured to establish a DC offset associated with the second differential stage.

21. The power supply PWN control system according to claim 20 further comprising a second reference voltage source configured to establish a DC offset associated with the PWM memory discharge device.

22. The power supply PWM control system according to claim 21 further comprising a third reference voltage source configured to establish a voltage control signal threshold between Current Program Mode Control and Voltage Mode Control.

23. A power supply pulse width modulation (PWM) control system comprising:
a differential amplifier system having a voltage control signal ($V_C$) input, a current sense ($V_S$) signal input and a signal output, the differential amplifier system operational to generate an output signal controlled by a current sense signal and a control voltage signal;
an analog latch;
a latch set element operational in response to a PWM system clock signal to set the analog latch;
a latch reset element operational in response to the differential amplifier system output signal to reset the analog latch and to generate an analog, PWM signal therefrom; and
a digital converter operational in response to the analog PWM signal to generate a digital PWM output signal therefrom.

24. The power supply PWM control system according to claim 23 wherein the analog latch comprises a capacitor.

25. The power supply PWM control system according to claim 24 wherein the latch set element comprises a MOS transistor.

26. The power supply PWM control system according to claim 25 wherein the latch reset element comprises a MOS transistor.

27. The power supply PWM control system according to claim 26 wherein the digital converter is a non-inverting buffer.

28. The power supply PWM control system according to claim 23 wherein the differential amplifier system comprises a high-speed command stage operational in response to the control voltage signal to generate a Voltage Mode Control signal.

29. The power supply PWN control system according to claim 28 wherein the differential amplifier system further comprises a high-speed sense stage operational in response to the current sense signal to generate a Current Program Mode Control signal.

30. The power supply PWM control system according to claim 29 wherein the differential amplifier system further comprises a voltage reference stage in communication with the high-speed command stage and operational to establish a control voltage signal threshold between the Voltage Mode Control signal and the Current Program Mode Control signal.

31. The power supply PWM control system according to claim 23 further comprising a first reference voltage source connected to the first differential stage such that the first reference voltage source and the first differential stage can establish an offset voltage associated with the second and third differential stages.

32. The power supply PWM control system according to claim 31 further comprising a second reference voltage source connected to the third differential stage such that the second reference voltage source and the third differential stage can establish an offset voltage associated with the latch reset element.

33. The power supply PWN control system according to claim 32 further comprising a third reference voltage source connected to the second differential stage such that the third reference voltage source and the second differential stage can establish a threshold voltage between a current sense signal and a control voltage signal.

* * * * *